United States Patent [19]

Taniguchi

[11] Patent Number: 5,365,096
[45] Date of Patent: Nov. 15, 1994

[54] THIN FILM CAPACITIVE MEMORY DEVICE WITH A HIGH DIELECTRIC CONSTANT

[75] Inventor: Kouji Taniguchi, Shiki, Japan

[73] Assignee: Sharp Kabushiki Kaisha, Osaka, Japan

[21] Appl. No.: 881,633

[22] Filed: May 12, 1992

[30] Foreign Application Priority Data

Oct. 18, 1991 [JP] Japan .................. 3-271410

[51] Int. Cl.⁵ .................. H01L 29/68; H01L 29/78; H01L 27/22; H01L 29/82
[52] U.S. Cl. .................. 257/296; 257/295; 257/306; 257/310
[58] Field of Search ............... 257/295, 296, 306, 310

[56] References Cited

U.S. PATENT DOCUMENTS

| | | | |
|---|---|---|---|
| 3,988,824 | 11/1976 | Bodway | 29/577 |
| 4,423,087 | 12/1983 | Howard et al. | 427/79 |
| 4,891,684 | 1/1990 | Nishioka et al. | 357/51 |
| 5,128,784 | 7/1992 | Suzuki et al. | 359/58 |

OTHER PUBLICATIONS

IEEE Transaction on Electron Devices, vol. 37, No. 9, Sep. 1990, pp. 1939–1946.
Tsutsumi, "Dielectric Properties of $Y_2O_3$ Thin Films Prepared by Vacuum Evaporation", Jap. Journal of Applied Physics, vol. 9 No. 7, Jul. 1970.

*Primary Examiner*—Andrew J. James
*Assistant Examiner*—Valencia M. Wallace
*Attorney, Agent, or Firm*—Nixon & Vanderhye

[57] ABSTRACT

A semiconductor device comprising a capacitor which comprises a lower electrode, a dielectric insulating film of a metal oxide, and a upper electrode. The lower electrode is made of at least yttrium (Y) or hafnium (Hf).

10 Claims, 3 Drawing Sheets

THIN FILM CAPACITIVE MEMORY DEVICE WITH A HIGH DIELECTRIC CONSTANT

BACKGROUND OF THE INVENTION

1. Field of the Invention

The invention relates to a semiconductor device, and more particularly to a DRAM made of a material of high dielectric constant and including a capacitor structure using the material.

2. Description of the Related Art

Development of DRAMs of higher density necessitates memory cells to be reduced in size and inevitably needs to keep a capacitor having capacitance at a specific degree. Materials of high dielectric constant for the capacitor and a capacitor structure using the materials as well as a stacked capacitor of a larger surface area and a thin film dielectric have been researched in this regard. A capacitor dielectric film of $Ta_2O_5$ has been given attention now for the thin film dielectric as having high dielectric constant. But, the $Ta_2O_5$ dielectric film when provided with a flower electrode using a polysilicon film have $SiO_2$ naturally formed at an interface between $Ta_2O_5$ and polysilicon, leading to a decrease of a practical dielectric constant of the $Ta_2O_5$ dielectric film.

In case that the lower electrode uses W (tungsten), since W has a higher free energy in producing oxide than Ta (tantalum) to be low in oxidizing effect, a naturally oxidized $WO_x$ film is not likely to be produced at the interface of $Ta_2O_5$ and W. Even when the $WO_x$ film is naturally produced at the interface, it does not behave as a dielectric. Hence, the decrease of dielectric constant of the $Ta_2O_5$ film can be avoided. However, when using W for the lower electrode, a corresponding $Ta_2O_5$ dielectric film is not provided with a uniform thickness in the course of processes for forming the same. It is difficult to avoid occurrence of leak current at the regions of locally thinner parts of the $Ta_2O_5$ dielectric film. Hence, a capacitor structure built even with the material, the $Ta_2O_5$ film, providing high dielectric constant does not achieve preferable high dielectric constant and resistance to leak current.

SUMMARY OF THE INVENTION

The present invention provides a semiconductor device comprising a capacitor having a lower electrode, a dielectric insulating film of a metal oxide and an upper electrode, the lower electrode being made of at least yttrium (Y) or hafnium (Hf).

The present invention also provides a method for preparing the above semiconductor device which comprises;

forming a lower electrode made of at least yttrium (Y) or hafnium (Hf) on a semiconductor substrate;

forming the dielectric insulating film on the lower electrode, followed by annealing, and then forming an upper electrode.

DETAILED DESCRIPTION OF PREFERRED EMBODIMENTS

According to the present invention, the lower electrode of a capacitor to be used in DRAMs or the like is made of a metal material having lower free energy in producing its oxide than a metal oxide of high dielectric constant serving as the dielectric insulating film. The metal material for the lower electrode is preferably yttrium (Y) or hafnium (Hf) which is likely to be oxidized than tantalum (Ta) when $Ta_2O_5$ having higher dielectric constant is used for the metal oxide. The lower electrode may use solely yttrium (Y), hafnium (Hf), a layer of polysilicon with yttrium (Y) or polysilicon with hafnium (Hf) layered in the order.

The lower electrode may be formed by the conventional methods, such as RF or DC sputtering process or the like using a target of yttrium or hafnium and an inactive gas, for example, argon. Thickness of the electrode is preferably 500 to 5000 Å when yttrium (Y) or hafnium (Hf) is solely used, and 500 to 50000 Å for polysilicon and 50 to 5000 Å for yttrium or hafnium to be layered thereon when polysilicon with yttrium or hafnium are layered in the order.

The $Ta_2O_5$ serving as the dielectric insulating film may be formed by the conventional methods, such as RF or DC sputtering process or the like using a sintered target of $Ta_2O_5$ and a mixture of argon gas and oxide gas and does preferably have thickness of 50 to 500 Å.

Also, the upper electrode may be formed by use of polysilicon, tungsten, tungsten silicide or the like to be 500 to 5000 Å in thickness to complete the capacitor.

Figure 1A:
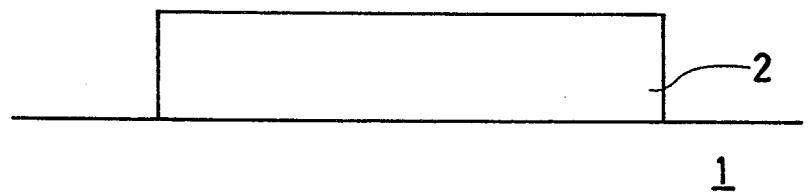
FIGS. 1a to 1c are a schematic diagrams showing a structure of a semiconductor device provided in a first example according to the present invention.

Referring to FIG. 1, in case where a lower electrode 2 of yttrium and a dielectric insulating film 3 (e.g., $Ta_2O_5$) are formed, an annealing is preferably carried out by applying an UV beam in an atmosphere of $O_2$ or $O_2$ and $O_3$ at a temperature of about 300° to 600° C. for 10 to 100 mins. In case where a lower electrode 9 of polysilicon 10 and yttrium 11 layered in the order is formed(see FIG. 2), an annealing is preferably carried out after the formation of the insulating film 13 by applying an UV beam under an atmosphere of $O_2$ atmosphere at a temperature of about 500° to 800° C. for about 10 to 100 mins.

When the lower electrode uses hafnium (Hf), an annealing is preferably carried out under the same condition as in the case using yttrium (Y).

The present invention provides in a capacitor to be used in DRAMs or the like a structure having high dielectric constant and resistance to leak current by using for a lower electrode a metal material, yttrium (Y) and hafnium (Hf) having lower free energy in producing oxide. The lower electrode of yttrium (Y) is provided thereon with $Ta_2O_5$ film followed by annealing in an oxidizing atmosphere, so that the lower electrode is more highly oxidized at locally thinner parts of the $Ta_2O_5$ film. $Y_2O_3$ which is produced at the interface $Ta_2O_5/Y$ upon formation of the $Ta_2O_5$ film and after annealing does have higher dielectric constant ($_y=11$) and prevents a decrease of practical dielectric constant of the $Ta_2O_5$ film. This is also the case of hafnium (Hf)($_H=25$).

The $Y_2O_3$ film and $Hf_2O_3$ film which well behave as dielectric insulating films and when formed resulting from oxidation particularly of locally thinner parts of the $Ta_2O_5$ film mitigate deterioration of dielectric properties of the Ta$_2$O$_5$ film due to its local thinner parts, thereby achieving high dielectric constant and resistance to leak current of the semiconductor device.

Next, examples of the present invention will be detailed with referring to the accompanied drawings.

EXAMPLE 1

Figure 3:
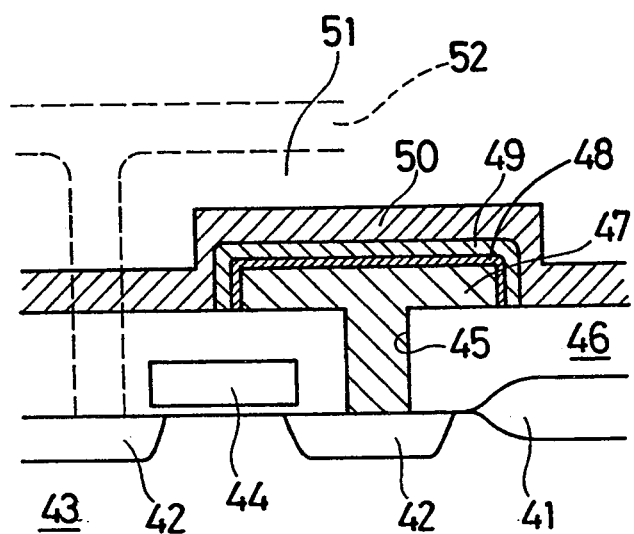
FIG. 3 is a schematic diagram showing a structure of a capacitor of the example.

The semiconductor device, as shown in FIG. 3, comprises a substrate made of silicon and having thereon a LOCOS film 41 and n+ diffused layers 42 serving as source/drain regions, a transistor device in the form of a word line 44 providing a gate, an interlayer dielectric film 46 having a contact hole 45 communicated with one of the n+ diffused layers, yttrium (Y) filling the contact hole and serving as a lower electrode 47 for the capacitor, Ta$_2$O$_5$ film serving as a dielectric insulating film 49, a polysilicon film providing an upper electrode 50 for the capacitor, and an interlayer dielectric film 51 separating a bit line 52 from the capacitor.

Next, a method for manufacturing the semiconductor device will be detailed with referring to FIG. 1.

Yttrium was deposited approximately 1000 Å forming an yttrium film 2 on the transistor device 1 having an interlayer dielectric film with a contact hole by RF sputtering process using a target of yttrium metal and Ar gas. The yttrium film was patterned into a lower electrode 2 (FIG. 1(a)).

Figure 1B:
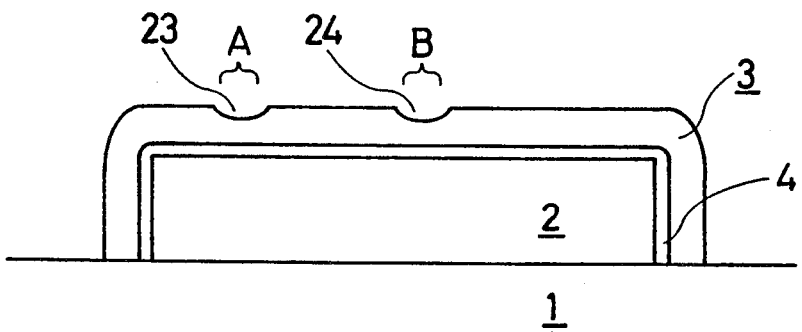
Figure 2A:
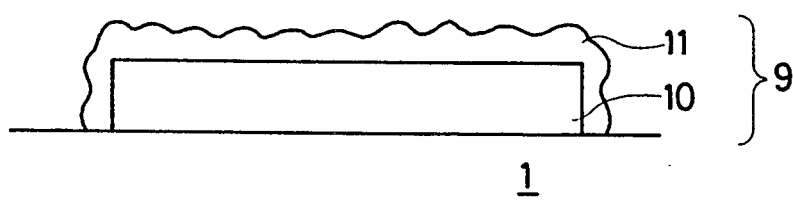
FIGS. 2a to 2c are a schematic diagrams showing a structure of a semiconductor device provided in a second example according to the present invention.

On the lower electrode 2 was formed a ultra-thin film 3 of Ta$_2$O$_5$, approximately 100 Å thick, serving as a dielectric insulating film by RF sputtering using a sintered target of Ta$_2$O$_5$ and a mixture gas of Ar and O$_2$ (FIG. 1(b)). In this instance, generation of locally thinner parts 23, 24 at the regions A and B as shown of the ultra-thin Ta$_2$O$_5$ film 3 was unavoidable. Also, a naturally oxidized yttrium film, the Y$_2$O$_3$ film 4 approximately 30 Å in thickness was formed in the lower electrode 2 at an interface with the Ta$_2$O$_5$.

Figure 1C:
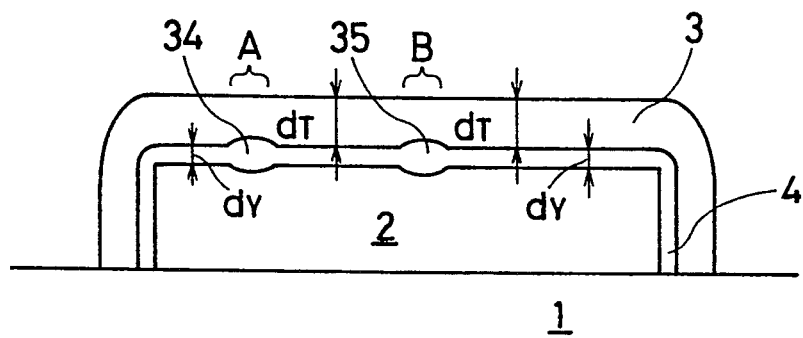

The product was annealed by applying UV in O$_2$ atmosphere at 500° C. for about 60 mins. Since the quality of the Ta$_2$O$_5$ film 3 was improved and oxidizing elements, such as oxygen and H$_2$O, were readily supplied to the regions A and B at the local thinner parts 23 and 24, oxidation of the lower electrode 2 was facilitated to form locally thicker Y$_2$O$_3$ films 34 and 35 at the regions A and B of the Y$_2$O$_3$ film 4 as shown in FIG. 1(c).

In this case, since the regions A and B of the Y$_2$O$_3$ film having local thicker parts have narrower surface areas, capacitance of the capacitor is represented by the following formula.

$$C = (A \cdot \epsilon_0 \cdot \epsilon_t \epsilon_y)/(d_y \epsilon_t + d_t \epsilon_y)$$

wherein A: surface areas of the capacitor, $\epsilon_t$, $\epsilon_y$: dielectric constant of Ta$_2$O$_5$ film and Y$_2$O$_3$ film, and $d_t$, $d_y$: thickness of Ta$_2$O$_5$ film and Y$_2$O$_3$ film.

When 100 Å of Ta$_2$O$_5$ film and 30 Å of Y$_2$O$_3$ film were provided, capacitance was higher than and about 1.7 times of the case forming a natural oxide SiO$_2$ at the interface Ta$_2$O$_5$/polysilicon by using a polysilicon electrode for the lower electrode as conventionally, wherein $\epsilon_t$ was 24, $\epsilon_y$ 11 and dielectric constant of SiO$_2$ 3.8.

The locally thinner parts 23 and 24 cause higher leak current but the local thicker parts 34 and 35 of the Y$_2$O$_3$ film at the regions A and B prevent leak current since the Y$_2$O$_3$ film has about 10 eV of band gap energy to be superior in dielectric properties.

EXAMPLE 2

By CVD process, polysilicon was deposited approximately 1000 Å forming a polysilicon film 10 on the transistor device 1 having an interlayer dielectric film with a contact hole. On the polysilicon film 10 was formed a yttrium film 11 by RF sputtering method using a target of yttrium metal and Ar gas. The yttrium film 11 was patterned into a lower electrode 9 (FIG. 2(a)). Mechanical strength and electrical resistance for the lower electrode 9 were provided by the polysilicon film 10. The yttrium film 11 was in the form of the ultra-thin film to be given a special shape of a bump on the surface as follows. The yttrium film 11 was set to be thinner than that of the example 1 to thereby have a larger surface area by use of the bump produced in growth of the yttrium film having the islands thereon. Growth of the yttrium film progressed generally from generation of the islands to unification thereof. The bump of the islands tended to remain at the thicker regions of the yttrium film at the stage when the unification started, so that the surface of yttrium film then had many swelling on the surface. The example made use of this state of the surface of yttrium film to effectively increase the surface area of electrode, thereby achieving high dielectric constant and resistance to leak current of the semiconductor device at a time.

Figure 2B:
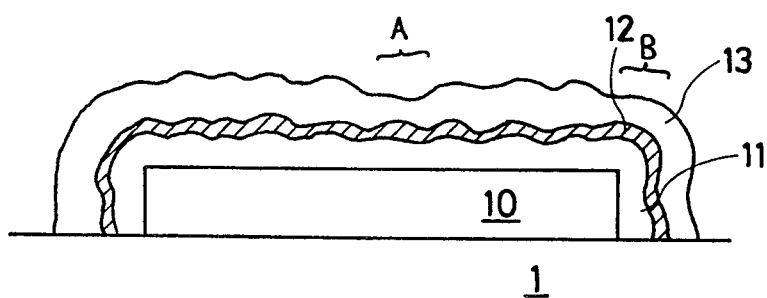

On the lower electrode 9 was formed a ultra-thin film 13 of Ta$_2$O$_5$, approximately 100 Å thick, serving as a dielectric insulating film by RF sputtering using a sintered target of Ta$_2$O$_5$ and a mixture gas of Ar and O$_2$ (FIG. 2(b)). In this instance, generation of locally thinner parts at the regions A and B as shown of the ultra-thin Ta$_2$O$_5$ film 13 was unavoidable. Also, a naturally oxidized yttrium film, the Y$_2$O$_3$ film 12 approximately 30 Å in thickness was formed between the Ta$_2$O$_5$ film 13 and the lower electrode 9.

Figure 2C:
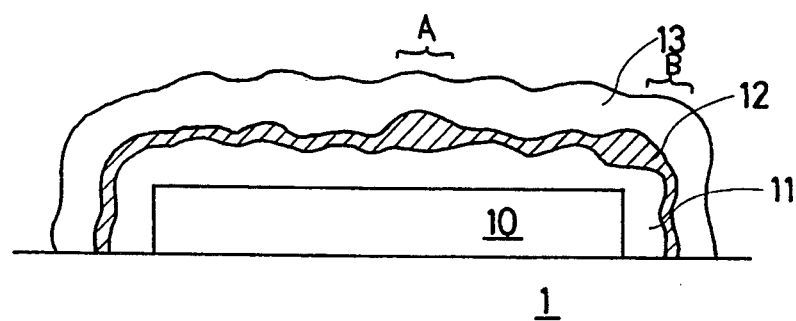

The product was annealed by applying UV in O$_2$ atmosphere at 500° C. for about 60 mins. Since the quality of the Ta$_2$O$_5$ film 13 was improved and oxidizing elements, such as oxygen and H$_2$O, were readily supplied to the regions A and B at the local thinner parts, oxidation of the lower electrode 11 was facilitated to form locally thicker Y$_2$O$_3$ films at the regions A and B of the Y$_2$O$_3$ film 12 as shown in FIG. 2(c).

When 100 Å of Ta$_2$O$_5$ film 13 and 30 Å of Y$_2$O$_3$ film 12 were provided, capacitance was higher than and about 1.7 to 2 times of the case forming a natural oxide SiO$_2$ at the interface Ta$_2$O$_5$/polysilicon by using a polysilicon electrode for the lower electrode as conventionally.

The yttrium film 11 of the above example was in the form of a ultra-thin film to be given a shape of a bump on the surface but may alternatively be given the swelling shape on the surface by the shadowing effect in an oblique vacuum evaporation system.

The examples 1 and 2 when using hafnium in place of yttrium for the lower electrode obtained the same effect.

What we claimed is:

1. A semiconductor device including a capacitor comprising:
   a lower electrode made of yttrium (Y);
   a dielectric insulating film of a metal oxide formed directly on the yttrium electrode and made of a material having a dielectric constant greater than silicon dioxide; and an upper electrode formed over the dielectric insulating film, wherein the lower electrode includes a first layer of polysilicon covered by second layer of yttrium (Y) which is covered by a third layer of $Y_2O_3$.

2. A semiconductor device including a capacitor comprising:
   a lower electrode made of hafnium (Hf);
   a dielectric insulating film of a metal oxide formed directly on the hafnium electrode and made of a material having a dielectric constant greater than silicon dioxide; and
   an upper electrode formed over the dielectric insulating film, wherein the lower electrode includes a first layer of polysilicon covered by a second layer of hafnium (Hf) which is covered by a third layer of $Hf_2O_3$.

3. A semiconductor device as set forth in claim 1, wherein the dielectric insulating film is made of $Ta_2O_5$.

4. A semiconductor device as set forth in claim 1, wherein the layer of the $Y_2O_3$ is thicker at thinner regions of the dielectric insulating film.

5. A semiconductor device as set forth in claim 4, wherein the layer of $Y_2O_3$ is formed annealing the lower electrode covered with the dielectric insulating film.

6. A semiconductor device as set forth in claim 5, wherein the annealing is conducted by applying a ultraviolet beam in an atmosphere of $O_2$ or $O_2$ and $O_3$ at a temperature from about 300° to about 600° C. for about 10 to about 100 minutes.

7. A semiconductor device as set forth in claim 2, wherein the dielectric insulating film is made of $Ta_2O_5$.

8. A semiconductor device as set forth in claim 2, wherein the layer of the $Hf_2O_3$ is thicker at thinner regions of the dielectric insulating film.

9. A semiconductor device as set forth in claim 8, wherein the layer of $Hf_2O_3$ is formed by annealing the lower electrode covered with the dielectric insulating film.

10. A semiconductor device as set forth in claim 9, wherein the annealing is conducted by applying a ultraviolet beam in an atmosphere of $O_2$ or $O_2$ and $O_3$ at a temperature from about 300° to about 600° for about 10 to about 100 minutes.

* * * * *